United States Patent
Familia

(10) Patent No.: US 7,310,021 B2
(45) Date of Patent: Dec. 18, 2007

(54) PHASE-LOCKED LOOP WITH TUNABLE-TRANSFER FUNCTION

(75) Inventor: Noam Familia, Modiin (IL)

(73) Assignee: Intel Corporation, Santa Clarac, CA (US)

( * ) Notice: Subject to any disclaimer, the term of this patent is extended or adjusted under 35 U.S.C. 154(b) by 55 days.

(21) Appl. No.: 11/321,481

(22) Filed: Dec. 29, 2005

(65) Prior Publication Data

US 2007/0152759 A1    Jul. 5, 2007

(51) Int. Cl.
*H03L 7/00*  (2006.01)
*H03L 7/085*  (2006.01)

(52) U.S. Cl. .................... 331/17; 331/25; 331/1 A; 327/157

(58) Field of Classification Search ............... 331/16, 331/17, 18, 25, 1 A, 175; 327/156, 157
See application file for complete search history.

(56) References Cited

U.S. PATENT DOCUMENTS

| | | | | |
|---|---|---|---|---|
| 5,095,288 | A  * | 3/1992 | Dent | 331/17 |
| 5,692,023 | A  * | 11/1997 | Clark | 375/376 |
| 6,181,756 | B1 * | 1/2001 | Moloudi | 375/374 |
| 7,019,572 | B2 * | 3/2006 | Miki et al. | 327/157 |
| 7,135,934 | B2 * | 11/2006 | Sanchez et al. | 331/18 |

* cited by examiner

*Primary Examiner*—Robert Pascal
*Assistant Examiner*—Ryan J Johnson
(74) *Attorney, Agent, or Firm*—Lee & Hayes, PLLC

(57) ABSTRACT

Embodiments of a phase-locked loop having a tunable-transfer function are presented herein. In implementations, a multipulse generator coupled between the chase frequency detector and charge pump tunes the bandwidth and peaking of the phase-locked loop based on an activity factor input are disclosed.

15 Claims, 5 Drawing Sheets

502
Form an Integrated Circuit that is Configured to Implement a Phase-locked Loop having a Transfer Function

504
Tune the Transfer Function

506
Adjust an Activity Factor that is Provided as an Input to a Plurality of Multipulse Generators of the Phase-locked Loop

*Fig. 5*

PHASE-LOCKED LOOP WITH TUNABLE-TRANSFER FUNCTION

BACKGROUND

Phase-locked loops are generally implemented using integrated circuits and may be utilized for a variety of purposes. For example, phase-locked loops may be utilized for clock recovery, frequency synthesis, and so on. The different uses of the phase-locked loops, however, may have differing requirements that may make a phase-locked loop that is optimized for a particular application less suitable (and even unsuitable) for use in a different application. Therefore, traditional techniques that were utilized to design phase-locked loops were tailored to the particular applications, in which, the respective phase-locked loop was to be utilized.

BRIEF DESCRIPTION OF THE DRAWINGS

FIG. 5 is a flow diagram depicting a procedure in an exemplary implementation in which a phase-locked loop is formed and tuned.

The same reference numbers are utilized in instances in the discussion to reference like structures and components.

DETAILED DESCRIPTION

In the following discussion, exemplary devices are described which may provide and/or utilize tuning for a phase-locked loops. Exemplary procedures are then described which may be employed by the exemplary devices, as well as by other devices.

Exemplary Devices

Figure 1:
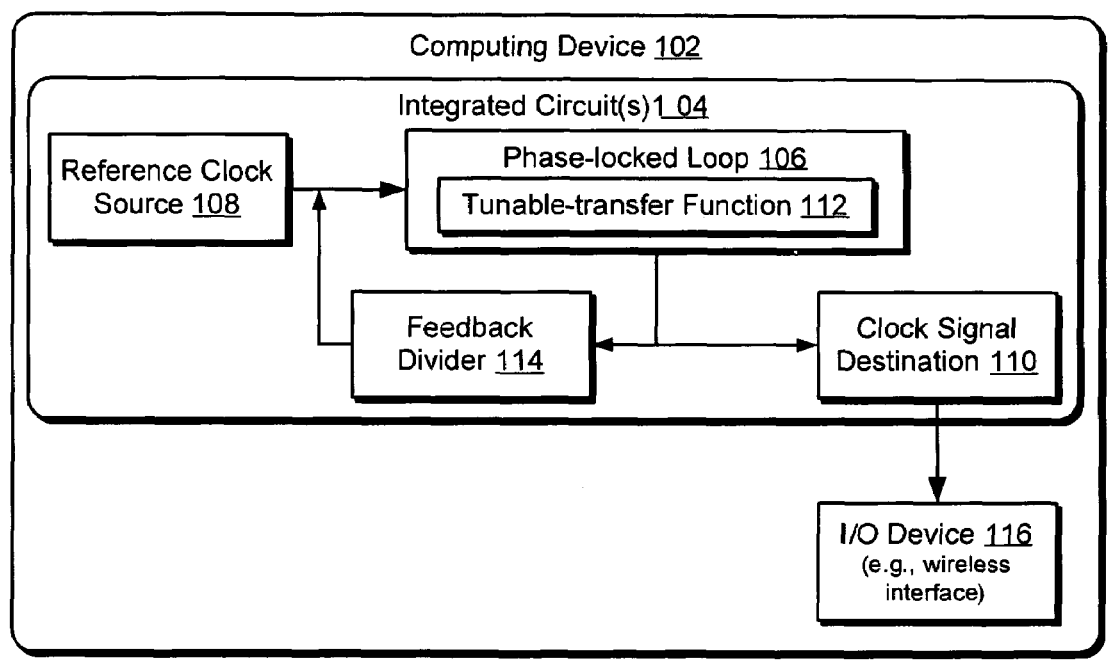
FIG. 1 is an illustration of an exemplary implementation of a computing device that is operable to employ a tunable phase-locked loop.

FIG. 1 illustrates an exemplary implementation 100 of a computing device 102 that is operable to employ tuning techniques for phase-locked loops. The computing device 102 may be configured in a variety of ways. For example, the computing device 102 may be configured as a desktop personal computer (PC), a notebook computer, a wireless phone, a server, a wireless base station, as local area network (LAN) equipment, a network access device (e.g., a broadband access device), a personal digital assistant (PDA), and so on.

The computing device 102 is illustrated as including one or more integrated circuit(s) 104, at least a portion of which are configured to provide a phase-locked loop 106. The phase-locked loop (PLL) 106 may be utilized for a variety of purposes, such as clock recovery, frequency synthesis, and so on. For example, the PLL 106 may be configured to phase align a reference clock source 108 (i.e., a signal source) with a clock signal destination 110, such as to align an internal core clock with a bus clock. The integrated circuit(s) 104, for instance, may include circuits which operate at a frequency that is "higher" relative to a frequency, at which, other circuits of the integrated circuit(s) 104 operate. Therefore, the PLL 106 is operable to enable data to be exchanged between these circuits by phase synchronizing respective clocks. A variety of other examples are also contemplated.

The PLL 106 has a transfer function, which may be thought of as a mathematical representation of a relationship between an input and an output of the PLL 106. Accordingly, the transfer function of the PLL 106 may play an important role in the computing system's performance. For example, as previously described PLLs may be optimized for different applications. Therefore, these different PLLs may have different respective transfer functions which have different respective "trade-offs" in the operation of the PLL 106. For instance, relatively higher bandwidth of the PLL 106 may better suppress thermal noise and supply noise, but relatively lower bandwidth may better suppress phase noise of a reference clock. In another instance, increasing the damping factor may reduce the peaking of the transfer function and thereby reduce phase noise on the peaking frequency, however, it may also increase cycle-to-cycle jitter resulting from the techniques used to increase the damping factor. A variety of other instances are also contemplated.

As illustrated in FIG. 1, the PLL 106 includes a tunable-transfer function 112 that, accordingly, provides adjustability of the transfer function of the PLL 106. Therefore, the PLL 106 may be employed in a variety of environments and may be tuned to be optimal for the respective environment, in which, it is employed, further discussion of which may be found in relation to FIG. 2.

The integrated circuit(s) 104 of the computing device 102 are further illustrated as including a feedback divider 114. The feedback divider 114 is operable to further control operation of the PLL 106. For example, the feedback divider 114 divides the output of the PLL 106, a result of which is then provided back to the PLL 106 for further comparison. By dividing the result, the PLL 106 may be used to generate a frequency that is greater than the reference frequency, further discussion of which may be found in relation to the following figure.

Figure 2:
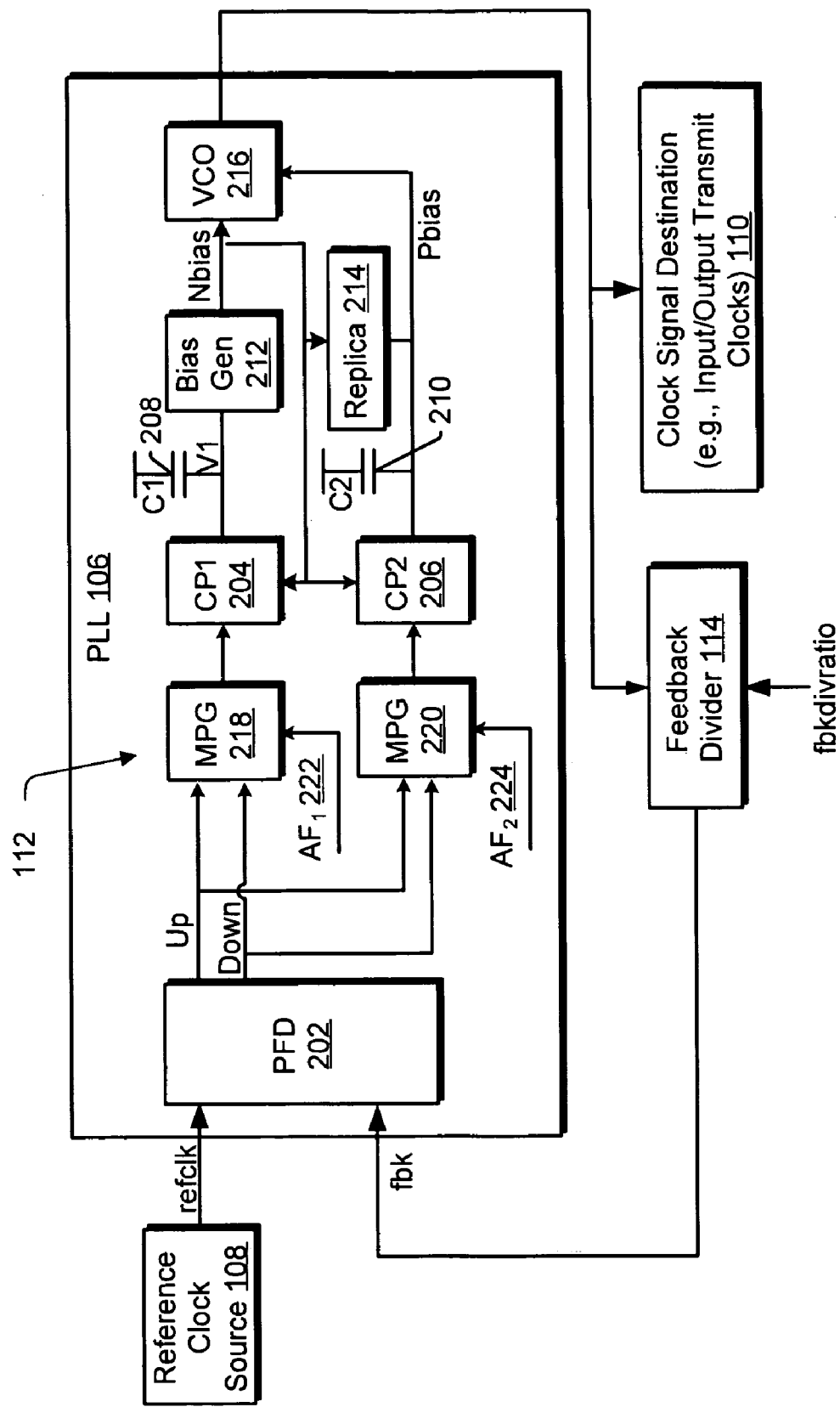
FIG. 2 is an illustration of an exemplary implementation of a system showing a phase-locked loop of FIG. 1 in greater detail.

FIG. 2 illustrates an exemplary implementation of a system 200 showing the PLL 106 of FIG. 1 in greater detail. The PLL 106 is implemented as a negative feedback system that includes a phase frequency detector (PFD) 202; one or more charge pumps (illustrated as first and second charge pumps (CP1, CP2) 204, 206); one or more capacitors (illustrated as first and second capacitors (C1, C2) 208, 210); a bias generator 212 (Bias Gen); a replica 214; and a voltage controlled oscillator (VCO) 216.

The PFD 202 compares two input frequencies (illustrated as "refclk" and "fbk" in FIG. 2) that denote, respectively, a reference signal and a feedback signal. The illustrated PFD 202 is operable to generate an output that is a measure of a phase difference of the two input frequencies, which are illustrated as "up" and "down" to represent differences in respective edges of the input signals. The differences in the relative numbers of "up" or "down" pulses output by the PFD 202 indicate whether the reference signal has a frequency that is higher or lower than the feedback frequency provided by the feedback divider 114.

The PLL 106 may also include one or more multipulse generators. The outputs of the PFD 202 are provided, for example, through respective multipulse generators 218, 220, to respective charge pumps (CP1, CP2) 204, 206 which charge respective capacitors (C1, C2) 208, 210 according to the pulses. The bias generator 212 (which may also be referred to as an "Nbias generator") and the replica 214 (which may also be referred to as a "Pbias" generator) may then use the charge from these capacitors (C1, C2) 208, 210 to control voltage provided to the VCO 216, and therefore control the output frequency of the VCO 216. The output of the VCO 216 is provided to the clock signal destination 110, as well as the feedback divider 114 as previously described. The clock signal destination may then provide an output to an input/output (I/O) device 116, such as a wireless interface.

The feedback divider 114, in the illustrated system 200 of FIG. 2, divides the output of the VCO 216 by a feedback divider ratio (illustrated as "fbkdivratio"), a result of which is then provided back to the PFD 202 for further comparison. For example, the feedback divider ratio may be set at 10 to 1 where the VCO 216 generates a frequency that is ten times greater than the reference signal of the reference clock source 108, i.e., "refclk" in FIG. 2. A variety of other ratios are also contemplated. Thus, the PLL 106 provides a closed-loop system that can "lock" to a difference in frequencies and compensate for this difference accordingly.

As previously described, however, the PLL 106 may be used in a variety of different applications, each of which may have a different optimal transfer function. Accordingly, the PLL 106 includes a tunable-transfer function 112 which is implemented in FIG. 2 via the multipulse generators 218, 220 (MPGs) and respective activity factors 222, 224 ($AF_1$, $AF_2$). The MPGs 218, 220 accept as an input the up and down pulses output by the PFD 202 and multiplies the pulses according to a respective activity factor 222, 224 ($AF_1$, $AF_2$) on its input. The outputs of the MPGs 218, 220 are then provided to the respective charge pumps 204, 206 to charge the respective capacitors 208, 210 as previously described to control the VCO 216.

In this way, the reference clock frequency may be increased (i.e., more edges are added in a cycle) to generate more up/down pulses, which may therefore average a correction supplied by the PLL 106 and thereby decrease feed-through jitter. Additionally, by providing a MPG 218, 220 for each respective charge pump 204, 206, bandwidth and peaking of the PLL 106 may be controlled independently. Thus, a single PLL may be provided for use in a variety of applications and accordingly conserve effort traditionally needed to design a particular PLL for each application. Yet further, the PLL may improve jitter performance of existing PLLs by tuning the respective PLLs in silicon tests, further discussion of which may be found in relation to the exemplary procedure 500 of FIG. 5.

Figure 3:
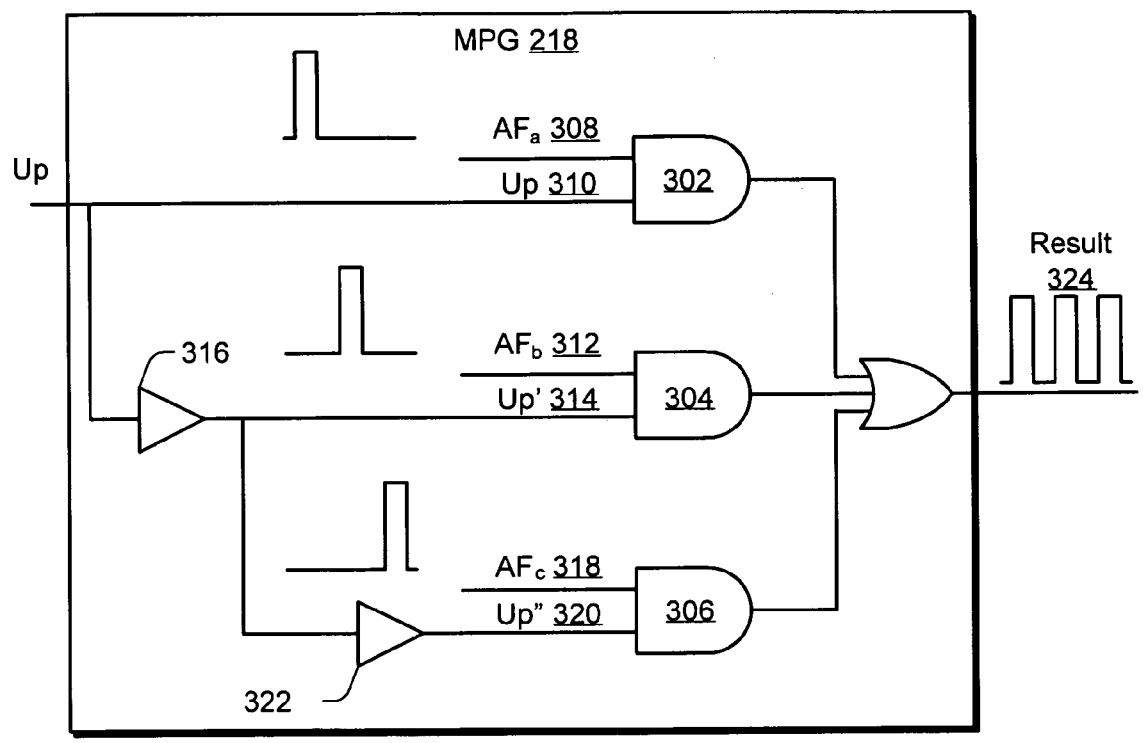
FIG. 3 is an illustration of an exemplary implementation showing a multipulse generator of FIG. 2 that is configured to provide multiple "up" pulses.

FIG. 3 illustrates an exemplary implementation 300 of the multipulse generator 218 of FIG. 2 that is configured to provide multiple "up" pulses and may include one or more delay cells. The multipulse generator 218 includes a plurality of logic gates 302, 304, 306. Logic gate 302 accepts, as inputs, an activity factor ($AF_a$) 308 and an "Up" 310 signal from the PFD 202 of FIG. 2. Logic gate 304 accepts, as inputs, another activity factor ($AF_b$) 312 and another "Up'" 314 signal from the PFD 202 of FIG. 2 that is delayed through use of a delay cell 316. Likewise, logic gate 306 accepts, as inputs, yet another activity factor ($AF_c$) 318 and yet another "Up''" 320 signal from the PFD 202 of FIG. 2, this one being delayed through use of delay cell 316 and another delay cell 322. The delay cells 316, 322 may be implemented in a variety of ways, such as through use of an inverter chain.

In an implementation, each of the activity factors (i.e., $AF_a$ 308, $AF_b$ 312 and $AF_c$ 318) may be set separately to arrive at a desired transfer function. For example, the activity factor of the MPG 218 in the illustrated example may be set anywhere from zero to three and may be generated using a counter that uses the reference clock as a clock. For instance, if an overall activity factor of "2.5" is desired, $AF_a$ 308 may be set to one, $AF_b$ 312 may be set to one, and $AF_c$ 318 may be set to 0.5 to a result 324 of "2.5".

Figure 4:
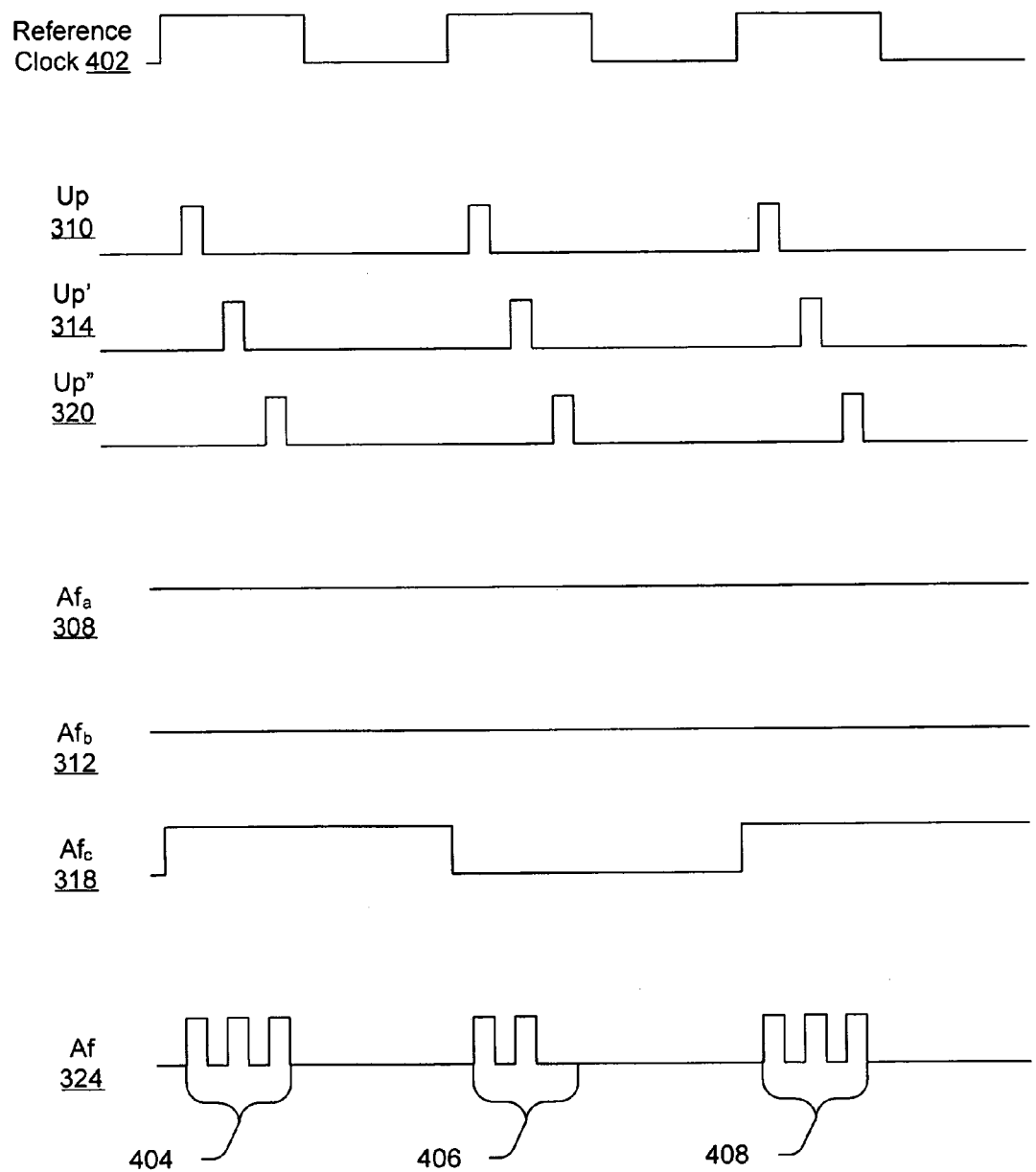
FIG. 4 is an illustration of an exemplary timing implementation showing an activity factor of "2.5" being set by using a multipulse generator of FIG. 3.

FIG. 4 illustrates a timing diagram 400 that further depicts the activity factor of "2.5" being set in this way. In this implementation, the reference clock 402 signal provides the up 310 signal and is also processed by the delay cells 316, 322 of FIG. 3 to provide respective up signals, i.e., Up' 314 and Up'' 320.

$AF_a$ 308 is set to one, $AF_b$ 312 is set to one, and $AF_c$ 318 is set to 0.5. Therefore, the AF 324 of the overall MPG 218 in this instance is output as alternating groups 404-408 of three pulses and two pulses. Although the MPG 218 of FIGS. 3 and 4 has been described for "up" pulses, it should be apparent that this circuit may also be utilized for "down" pulses as well, i.e., the illustrated MPG may also implement the MPG 220 of FIG. 2 to provide the tunable-transfer function 112 of FIG. 1.

In a second order model (when ignoring capacitor $C_2$), the following equations may be observed for bandwidth and peaking, respectively:

$$\omega_n = \sqrt{\frac{I_1 K_1}{N C_1}}$$

$$\zeta = \omega_n \frac{R C_1}{2} \frac{I_2 K_2}{I_1 K_1}$$

where:
  $K_1$ is the VCO gain from nbias to VCO output frequency;
  $K_2$ is the VCO gain from pbias to VCO output frequency;
  $I_1$ is the $CP_1$ (charge pump 1) current;
  $I_2$ is the $CP_2$ current;
  N is the feedback divider value;
  R is the replica's output resistance; and
  $C_1$ is the capacitance of the main low-pass filter (LPF) capacitor.

When multiplying the up & down pulses, $I_1$ and $I_2$ currents are effectively changed as follows:

$$I_{1eff} = I_1 \cdot AF_1$$

$$I_{2eff} = i_2 \cdot AF_2$$

Substituting this into the second order equation the following is observed:

$$\omega_{n,eff} = \omega_n \sqrt{AF_1}$$

$$\zeta_{eff} = \zeta \frac{AF_2}{\sqrt{AF_1}}$$

It should be noted that "$\omega_n$" is correlated with the PLL and that "$\zeta_{eff}$" is correlated with the peaking. From the equations above, it is apparent that the bandwidth and peaking may be controlled independently.

Exemplary Procedures

The following discussion describes phase-locked loop tuning techniques that may be implemented utilizing the previously described systems and devices. The procedures are shown as a set of blocks that specify operations performed by one or more devices and are not necessarily limited to the orders shown for performing the operations by the respective blocks.

FIG. 5 depicts a procedure 500 in an exemplary implementation in which a phase-locked loop is formed and tuned. An integrated circuit is formed that is configured to implement a phase-locked loop having a transfer function (block 502). For example, a variety of semiconductor processes may be utilized to form the PLL 106 on a "chip".

Once formed, the transfer function of the phase-locked loop is tuned (block 504). Continuing with the previous example, the PLL 106 may include a tunable-transfer function 112 implemented via a plurality of multipulse generators 218, 220. Activity factors 222, 224 provided as inputs to the respective multipulse generators 218, 220 may then be adjusted (block 506) to "tune" the transfer function. A variety of other examples are also contemplated.

CONCLUSION

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. A phase-locked loop comprising:
a phase frequency detector;
one or more charge pumps; and
one or more multipulse generators communicatively coupling the phase frequency detector with the one or more charge pumps, wherein each said multipulse generator accepts as an input an activity factor to provide a tunable-transfer function.

2. A phase-locked loop as described in claim 1, wherein the multipulse generators are tunable to control bandwidth and peaking factor independently.

3. A phase-locked loop as described in claim 1, wherein:
each said multipulse generator includes a plurality of logic gates, each of which accepts as an input a respective activity factor that together provide the activity factor of the multipulse generator; and
each said respective activity factor specifies a respective multiple, by which, pulses received by a respective said logic gate are to be multiplied.

4. A phase-locked loop as described in claim 3, wherein at least one said respective activity factor may be set different than another said respective activity factor.

5. A phase-locked loop as described in claim 3, wherein:
each said multipulse generator includes one or more delay cells that are configured to delay an input signal and provide a delayed output signal;
at least one said logic gate accepts as an input a respective said delayed output signal; and
another said logic gate accepts as an input the input signal.

6. A phase-locked loop as described in claim 1, wherein:
the phase frequency detector outputs up and down pulses;
a first said multipulse generator that multiplies the up pulses by a first activity factor to provide a first output;
a second said multipulse generator that multiplies the down pulses by a second activity factor to provide a second output; and
first and second said charge pumps accept, respectively, the first and second outputs.

7. One or more integrated circuits comprising a phase-locked loop having a transfer function that is tunable to control bandwidth and peaking independently, wherein the transfer function is tunable in response to an activity factor of a multipulse generator disposed between a phase frequency detector and one or more charge pumps of the phase-locked loop.

8. One or more integrated circuits as described in claim 7, wherein:
the multipulse generator includes:
a plurality of logic gates, each of which accepts as an input a respective activity factor that together provide the activity factor of the multipulse generator; and
one or more delay cells are configured to delay an input signal and provide a delayed output signal such that at least one said logic gate accepts as an input a respective said delayed output signal and another said logic gate accepts as an input the input signal;
each said respective activity factor specifies a respective multiple, by which, pulses received by a respective said logic gate are to be multiplied; and
at least one said respective activity factor is set different than another said respective activity factor.

9. An apparatus comprising:
a wireless interface; and
a phase-locked loop having a tunable-transfer function to provide an output to the wireless interface, wherein the phase-locked loop comprises:
a phase frequency detector;
one or more charge pumps; and
one or more multipulse generators communicatively coupling the phase frequency detector with the one or more charge pumps, wherein each said multipulse generator accepts as an input a respective activity factor to provide the tunable-transfer function.

10. An apparatus as described in claim 9, wherein at least one said multipulse generator comprises:
one or more delay cells; and
a plurality of logic gates,
wherein:
each said logic gate accepts as an input a respective activity factor as an input;
the one or more delay cells are configured to delay an input signal and provide a delayed output signal;
at least one said logic gate accepts as an input a respective said delayed output signal; and
another said logic gate accepts as an input the input signal.

11. An apparatus as described in claim 9, wherein:
the tunable-transfer function is implemented via one or more multipulse generators;
each said multipulse generator communicatively couples a phase frequency detector with a respective charge pump and includes a plurality of logic gates, each of which accepts as an input a respective activity factor; and
each said activity factor specifies a respective multiple, by which, pulses received by a respective said logic gate are to be multiplied.

12. An apparatus as described in claim 11, wherein the tunable-transfer function accepts programmable activity factors.

13. An apparatus as described in claim 11, wherein:
each said multipulse generator includes one or more delay cells that are configured to delay an input signal and provide a delayed output signal;

at least one said logic gate accepts as an input a respective said delayed output signal; and another said logic gate accepts as an input the input signal.

14. An apparatus as described in claim 9, wherein the phase-locked loop comprises:
- a phase frequency detector that outputs up and down pulses;
- a first multipulse generator that multiplies the up pulses by an activity factor to provide a first output;
- a second multipulse generator that multiplies the down pulses by an activity factor to provide a second output; and
- first and second charge pumps that accept, respectively, the first and second outputs.

15. A method comprising:

forming an integrated circuit to implement a phase-locked loop having a transfer function; and tuning the transfer function, wherein:

the tuning includes adjusting an activity factor that is provided as an input to a plurality of multipulse generators; and each said multipulse generator communicatively couples a phase frequency detector of the phase-locked loop to a respective charge pump of the phase-locked loop.

* * * * *